United States Patent
Takasu et al.

(10) Patent No.: US 8,102,687 B2
(45) Date of Patent: Jan. 24, 2012

(54) CONTROL APPARATUS FOR CONTROLLING POWER CONVERSION APPARATUS

(75) Inventors: Hisashi Takasu, Hazu-gun (JP); Tomonori Kimura, Oobu (JP)

(73) Assignee: Denso Corporation, Kariya (JP)

( * ) Notice: Subject to any disclaimer, the term of this patent is extended or adjusted under 35 U.S.C. 154(b) by 392 days.

(21) Appl. No.: 12/406,505

(22) Filed: Mar. 18, 2009

(65) Prior Publication Data

US 2009/0237052 A1 Sep. 24, 2009

(30) Foreign Application Priority Data

Mar. 21, 2008 (JP) ................................ 2008-072915

(51) Int. Cl.
*H02M 7/5387* (2007.01)
*H02H 7/122* (2006.01)
(52) U.S. Cl. ..................................... 363/132; 363/56.02
(58) Field of Classification Search .................... 363/55, 363/56.01, 56.02, 97, 98, 131, 132; 318/800–803
See application file for complete search history.

(56) References Cited

U.S. PATENT DOCUMENTS

| | | | |
|---|---|---|---|
| 5,608,616 A * | 3/1997 | Umeda et al. ................ | 363/132 |
| 5,805,438 A * | 9/1998 | Takada et al. ................ | 363/98 |
| 6,486,632 B2 * | 11/2002 | Okushima et al. ........... | 318/599 |
| 7,616,466 B2 * | 11/2009 | Chakrabarti et al. ......... | 363/132 |
| 2001/0002782 A1 | 6/2001 | Shimane et al. | |
| 2005/0218876 A1 | 10/2005 | Nino | |
| 2006/0097707 A1 | 5/2006 | Inoshita et al. | |

FOREIGN PATENT DOCUMENTS

| | | |
|---|---|---|
| JP | 05-328746 | 12/1993 |
| JP | 10-070878 | 3/1998 |
| JP | 11-234104 | 8/1999 |
| JP | 2001-169407 | 6/2001 |
| JP | 2003-274672 | 9/2003 |
| JP | 2005-253183 | 9/2005 |
| JP | 2005-295671 | 10/2005 |
| JP | 2006-136125 | 5/2006 |

OTHER PUBLICATIONS

Japanese Office Action dated Jan. 12, 2010, issued in corresponding Japanese Application No. 2008-072915, with English translation.
Baba, "Attention-Getting Power Device is Incorporated in a Power Circuit for Evaluation! Finding Out the Proficiency of High-Power Elements of SiC and CoolMOS", Transistor Technology, Dec. 2004, pp. 197-204 with English translation (pp. 1-18).

* cited by examiner

*Primary Examiner* — Matthew Nguyen
(74) *Attorney, Agent, or Firm* — Nixon & Vanderhye P.C.

(57) ABSTRACT

The control apparatus is for controlling a power conversion apparatus with a chopper circuit including at least one voltage-controlled type switching element provided with a drive circuit, and a coil to generate back electromotive force. The control apparatus includes a function of outputting an operation command signal to the drive circuit to control an output voltage of the power conversion apparatus, a second function of setting, on the basis a current flowing through the switching element, a switching speed of the switching element to such a value that noise exceeding a withstand voltage between a conduction control terminal and an output terminal of the switching element can be prevented from occurring when the switching element is switched, and a third function of adjusting the drive circuit to drive the switching element such that the switching element is switched at the switching speed set by the second function.

9 Claims, 12 Drawing Sheets

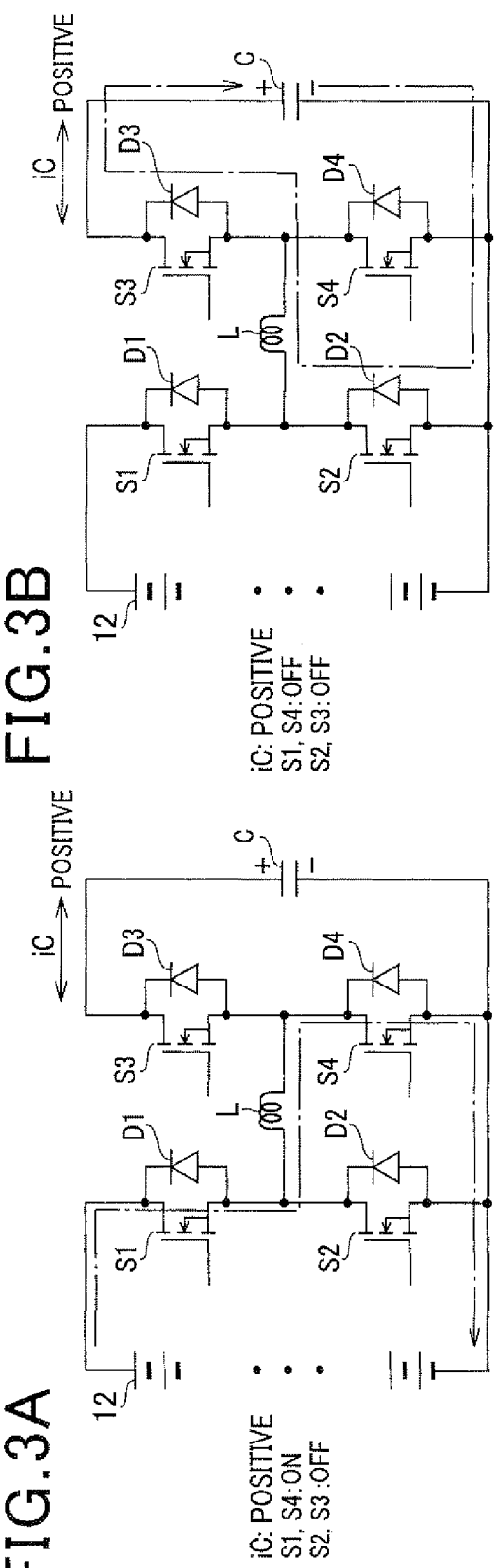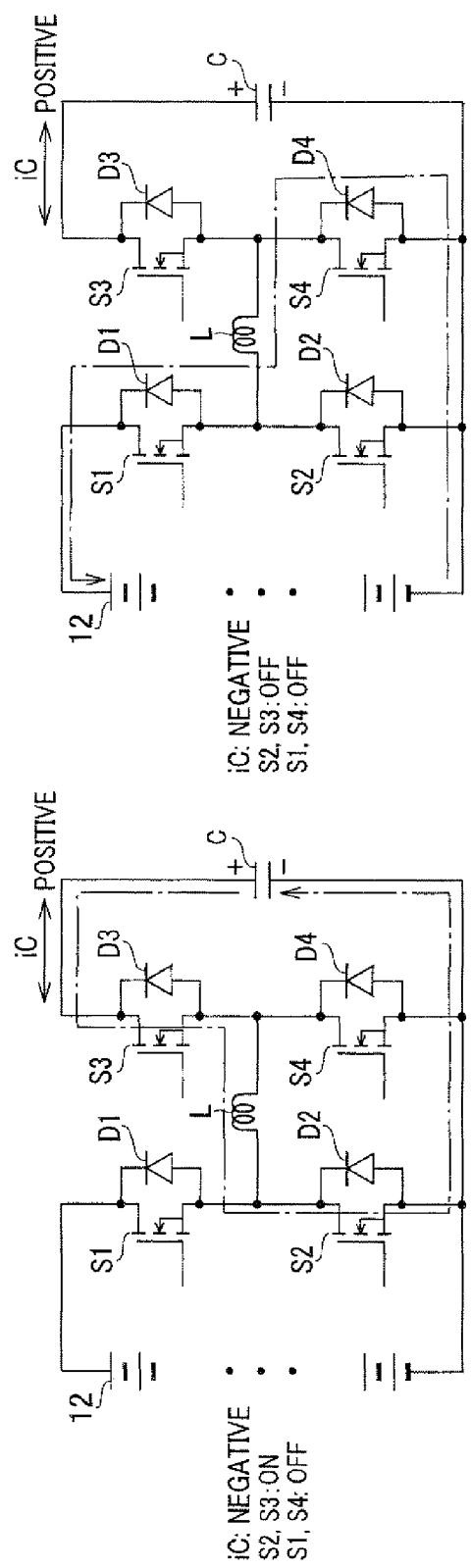

US 8,102,687 B2

CONTROL APPARATUS FOR CONTROLLING POWER CONVERSION APPARATUS

CROSS-REFERENCE TO RELATED APPLICATION

This application is related to Japanese Patent Application No. 2008-72915 filed on Mar. 21, 2008, the contents of which are hereby incorporated by reference.

BACKGROUND OF THE INVENTION

1. Field of the Invention

The present invention relates to a control apparatus for controlling an output voltage of a power conversion apparatus with a chopper circuit including voltage-controlled type switching elements and a coil to generate back electromotive force, and relates to a power conversion system including the control apparatus and the power conversion apparatus.

2. Description of Related Art

It is known to on/off-control switching elements of an inverter in accordance with results of comparison between a command voltage to an electric rotating machine and a carrier signal, so that the electric rotating machine is applied with a voltage having a step-like sinusoidal waveform at each input terminal thereof. However, since the output voltage of the inverter varies in a step-like manner, there occurs a problem that the neutral-point voltage of the motor varies by a large amount as a result of which common mode noise and a large surge voltage appear.

To cope with such a problem, it is known to provide a DC/DC converter with a capacitor in which a converted voltage to be supplied to one of the three phases of a three-phase electric rotating machine is accumulated as shown in FIG. 19. For more detail, refer to Japanese Patent Application Laid-open No. 2006-136125. In this case, since the three-phase electric rotating machine is applied with a voltage having a smooth sinusoidal waveform, it is possible to suppress the surge voltage.

Meanwhile, when such a DC/DC converter is used so as to pass a current between the DC/DC converter and an electric rotating machine, it is necessary to rapidly change the voltage accumulated in the capacitor thereof. In this case, since a switching frequency of the switching elements becomes high, the switching elements are required to have a switching speed sufficiently fast in order to keep control response of the output voltage sufficiently fast.

However, the inventors of the present application have found that the switching elements having such a high switching speed tend to generate noise exceeding the withstand voltage between a conduction control terminal and an output terminal thereof.

SUMMARY OF THE INVENTION

The present invention provides a control apparatus for controlling a power conversion apparatus including at least one voltage-controlled type switching element provided with a drive circuit, and a coil connected to said switching element, said control apparatus operating to adjust an absolute value of a current chopped by repeating on/off operation of said switching element and flowing through said coil in order to convert an input voltage of said power conversion apparatus to a required output voltage, said control apparatus comprising:

a first function of outputting an operation command signal to the drive circuit of the switching element to control an output voltage of the power conversion apparatus, the operation command signal indicating one of on-state and off-state of the switching element;

a second function of setting, on the basis of a current value of a current flowing through the switching element, a switching speed of the switching element to such a value that noise exceeding a withstand voltage between a conduction control terminal and an output terminal of the switching element can be prevented from occurring when the switching element is switched between on-state and off-state by the drive circuit; and a third function of adjusting the drive circuit to drive the switching element such that the switching element is switched between on-state and off-state at the switching speed set by the second function.

According to the present invention, it is possible to control with a high degree of reliability and accuracy an output voltage of a power conversion apparatus with a chopper circuit including at least one voltage-controlled type switching element, and a coil connected to the switching element to generate back electromotive force.

Other advantages and features of the invention will become apparent from the following description including the drawings and claims.

BRIEF DESCRIPTION OF THE DRAWINGS

In the accompanying drawings:

FIGS. 3A to 3D are diagrams for explaining chopper control performed in the first embodiment;

PREFERRED EMBODIMENTS OF THE INVENTION

First Embodiment

Figure 1:
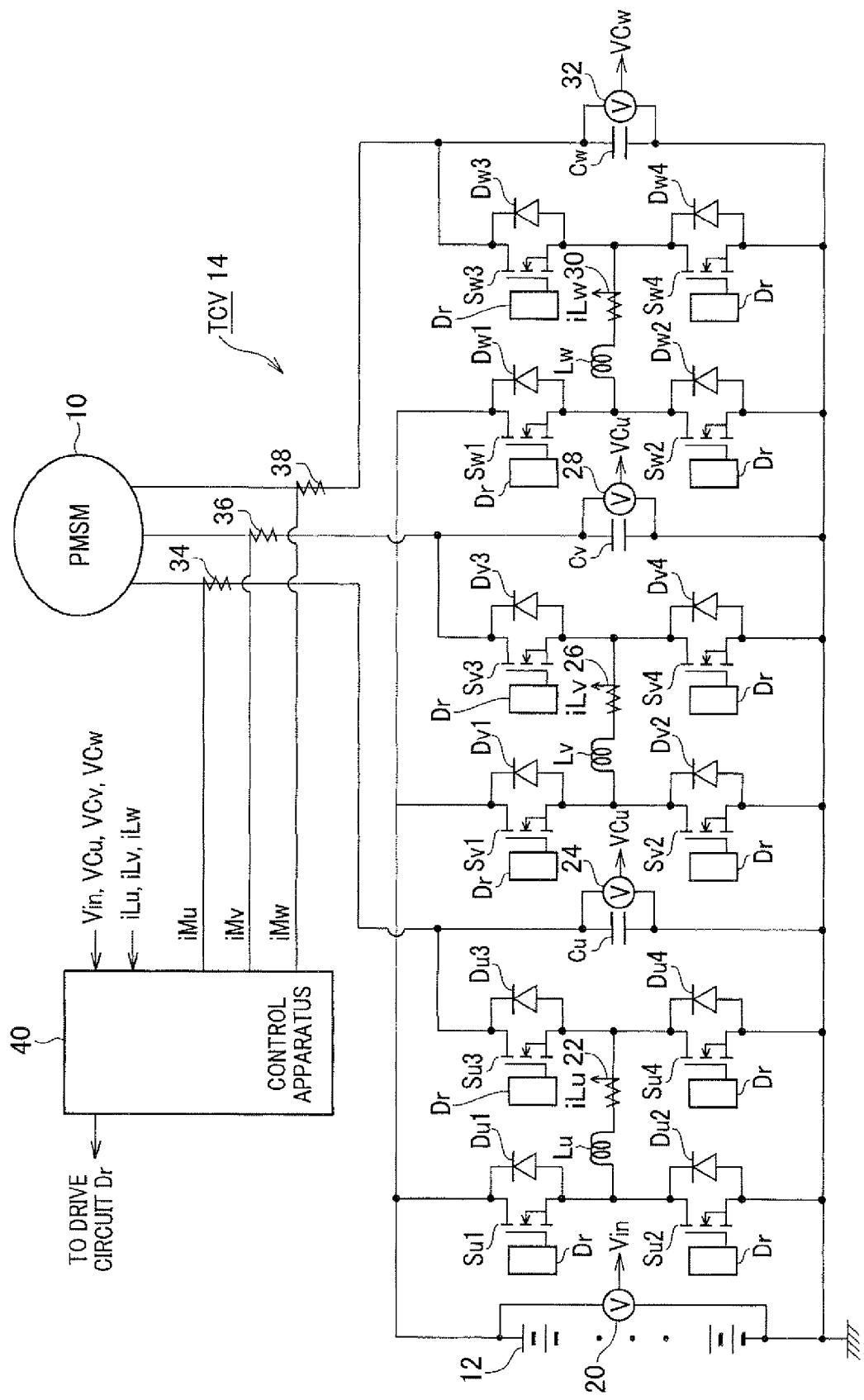
FIG. 1 is a diagram showing an overall structure of a power conversion system for a hybrid vehicle, the system including a power conversion apparatus supplying power to a motor and controlled by a control apparatus according to a first embodiment of the invention.

FIG. 1 is a diagram showing an overall structure of a control system including a power conversion apparatus and a control apparatus for controlling the output voltage of the power conversion apparatus according to a first embodiment of the invention.

In this figure, the reference character 10 denotes a permanent magnet type synchronous motor (PMSM) used as a drive power generating apparatus of a hybrid vehicle, 12 denotes a high voltage battery which may be a nickel hydrogen storage battery or a lithium ion storage battery, 14 denotes a three-phase converter (TCV) as the power conversion apparatus which supplies electric power to the motor 10, and 40 denotes the control apparatus. The motor 10 is connected to the high voltage battery 12 through the TCV 14.

The TCV 14 includes three converters provided for the respective three phases of the motor 10, each of which is capable of varying its output voltage continuously. In this embodiment, the converters constituting the TCV 14 are non-inversion type back boost converters. The converter for the U-phase of the motor 10 includes a series connection of power switching elements Su1 and Su2 parallel-connected to the high voltage battery 12, a capacitor Cu connected between the U-phase of the motor 10 and the ground, a series connection of power switching elements Su3 and Su4 parallel-connected to the capacitor Cu, and a coil Lu connected between the connection node of the switching elements Su1 and Su2 and the connection node of the switching elements Su3 and Su4. In this embodiment, the switching elements Su1, Su2, Su3 and Su4 are power MOSFETs. The switching elements Su1, Su2, Su3 and Su4 are parallel-connected with diodes Du1, Du2, Du3 and Du4, respectively. The converters for the V-phase and the W-phase have the same structure as the above described converter for the U-phase.

The control system further includes the following components to detect various states thereof.

A voltage sensor 20 to detect the voltage of the high voltage battery 12.

A current sensor 22 and a voltage sensor 24 provided in the converter for the U-phase to detect a current flowing through the coil Lu and a voltage of the capacitor Cu.

A current sensor 26 and a voltage sensor 28 provided in the converter for the V-phase to detect a current flowing through the coil Lv and a voltage of the capacitor Cv.

A current sensor 30 and a voltage sensor 32 provided in the converter for the W-phase to detect a current flowing through the coil Lw and a voltage of the capacitor Cw.

Current sensors 34, 36 and 38 to detect respective phase currents of the motor 10 as the state of the motor 10.

The control apparatus 40 receives sensor signals from the above described sensors, and control the TCV 14 in accordance with the received sensor signals. In more detail, the control apparatus 40 on/off-controls the switching elements Su1-Su4, Sv1-Sv4 and Sw1-Sw4 through drive circuits Dr to perform chopper control on the voltage of the high voltage battery 12, to thereby convert the battery voltage into a required voltage and accumulates it in the capacitors Cu, Cv and Cw.

Figure 2:
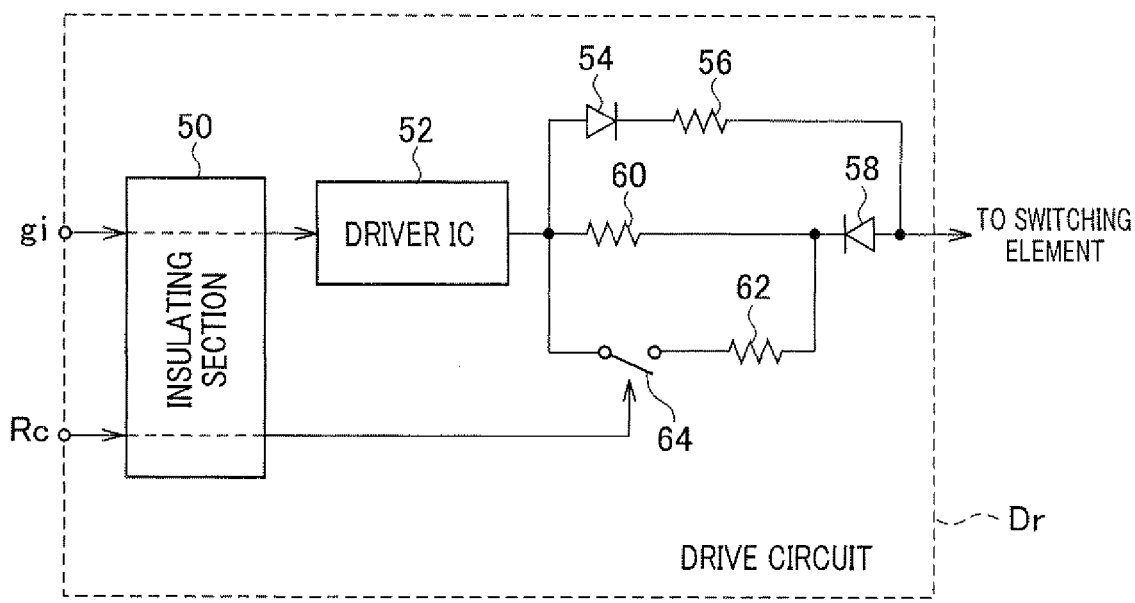
FIG. 2 is a diagram showing a circuit structure of drive circuits to drive switching elements included in the power conversion apparatus of the first embodiment.

FIG. 2 is a diagram showing a circuit structure of the drive circuit Dr. Generally, in the following description, the reference characters are not added with an alphabetical suffix indicative of one of the respective phases of the motor 10. For example, "the power switching elements Sui, Svi and Swi" (i being 1 to 4) are indicated as "the power switching element Si".

As shown in FIG. 2, the drive circuit Dr receives through an insulating section 50 thereof an operation command signal gi used to operate the power switching element Si, and a resistance value command signal Rc designating a value of the resistance of a gate resistor constituted by a resistor 60 and a resistor 62. The operation command signal gi is converted into a voltage signal by a driver IC 52. To charge the gate of the power switching element Si to thereby turn on the power switching element Si, the voltage signal outputted from the driver IC 52 is applied to the gate of the power switching element Si through a diode 54 and a resistor 56. On the other hand, to discharge the gate of the power switching element Si to thereby turn off the power switching element Si, the charge in the gate of the power switching element Si is drawn into the driver IC 52 through an electrical path including a diode 58 and the resistor 60 constituting the gate resistor. However, when a switching element 64 is turned on, the charge in the gate of the power switching element Si is drawn into the driver IC 52 also through an electrical path including the diode 58 and the resistor 62 constituting the gate resistor.

The resistors 60 and 62 are linear components, and the switching element 64 is a component which is on/off-controlled in accordance with the resistance value command signal Rc received through the insulating section 50. Accordingly, when the resistance value command signal Rc designates a low resistance, the switching element 64 is turned on, while when it designates a high resistance, the switching element 64 is turned off.

Next, chopper control performed in this embodiment is explained with reference to FIGS. 3A to 3D. In FIGS. 3A to 3D, only one of the three converters constituting the TCV 14 is shown. In these figures, it is assumed that an amount of charge moving between terminals of the capacitor C and the motor 10 is negligibly small for ease of explanation.

First, explanation is given for the case where the sign of an output current of the chopper circuit constituted by the power switching elements 51 to S4 and the coil L is positive (when the capacitor C is charged by the output current) with reference to FIGS. 3A and 3B. As shown in FIG. 3A, when the power switching elements S1 and S4 are turned on, a current flows through a closed loop circuit constituted by the high voltage battery 12, power switching element S1, coil L and power switching element S4. Thereafter, when the power switching elements S1 and S4 are turned off, a current due to a back electromotive force of the coil L flows through a closed loop constituted by the coil L, diode D3, capacitor C and diode D2. As a result, the capacitor C is charged.

Next, explanation is given for the case where the sign of the output current of the chopper circuit of the converter is negative with reference to FIGS. 3C and 3D. As shown in FIG. 3C, when the power switching elements S2 and S3 are turned on, a current flows through a closed loop circuit constituted by the capacitor C, power switching element S3, coil L and power switching element S2. As a result, the capacitor C is discharged. Thereafter, when the power switching elements S2 and S3 are turned off, a current due to a back electromotive force of the coil L flows through a closed loop circuit constituted by the coil L, diode D1, high voltage battery 12 and diode D4.

Figure 4:
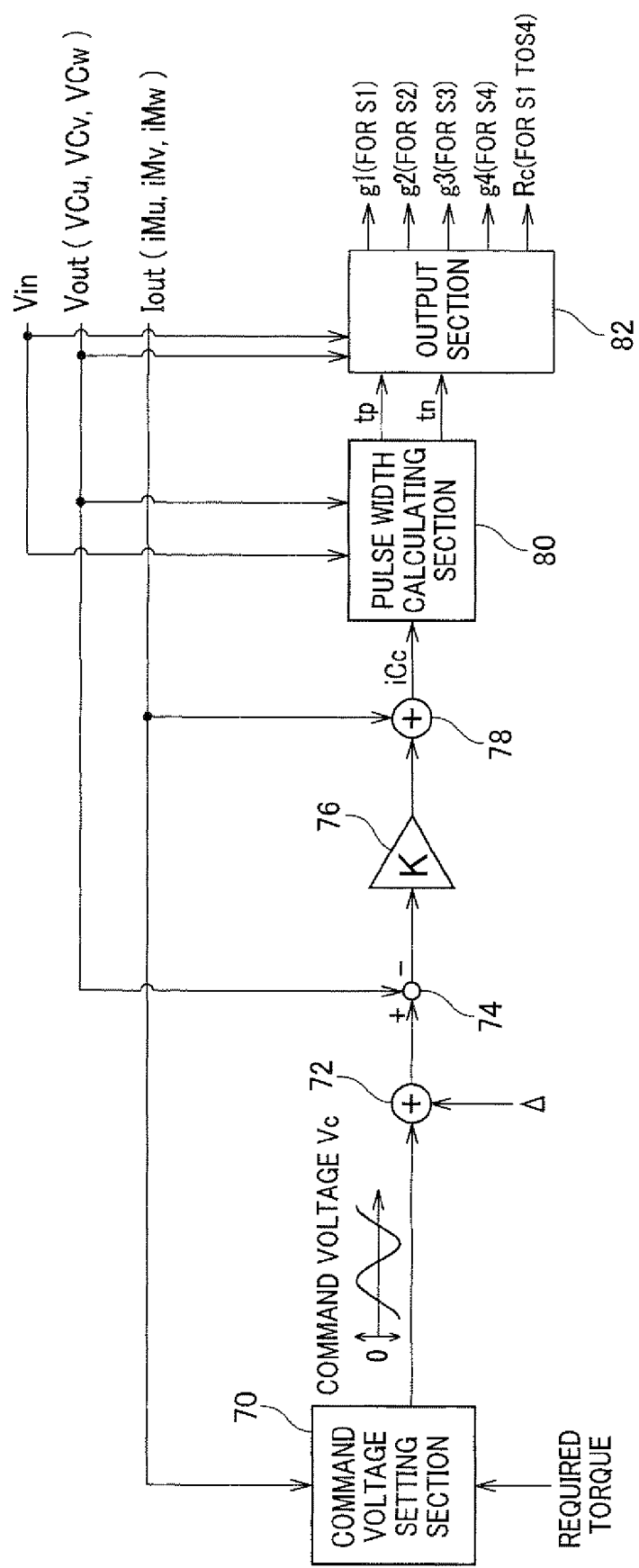
FIG. 4 is a block diagram of the control apparatus of the first embodiment.

By performing the above chopper control to convert the voltage of the high voltage battery 12 as a DC power supply, to thereby adjust the voltage of the capacitor C, it is possible to apply an adjusted analog voltage to the motor 10. However, actually, due to movement of charge between the capacitor C and the motor 10, rise and fall of the voltage of the capacitor C and the sign of the output current of the chopper circuit are not in a one-to-one relationship in a precise sense. In this embodiment, in order to correctly control the voltage of the capacitor C even when rise and fall of the voltage of the capacitor C and the sign of the output current of the chopper circuit are not in a one-to-one relationship, the operation command signal gi is generated by the process explained below with reference to FIG. 4. As shown in FIG. 4, the control apparatus 40 includes a command voltage setting section 70, an offset correcting section 72, a deviation value calculating section 74, a feedback control section 76, a feedforward correcting section 78, a pulse width calculating section 80, and an output section 82.

The command voltage setting section 70 sets a command value of the output voltage (command voltage Vc) of the converter on the basis of the phase currents iMu, iMv and iMw of the motor 10 (the output current Iout of the converter), and a required torque. This process may be performed by a well-known current feedback control. In this case, the command voltage Vc of each phase of the motor 10 is calculated as a feedback control amount in feedbacking actual currents in the d-axis and q-axis, which can be obtained by performing 2-phase conversion on the phase currents iMu, iMv and iMw, to the command currents in the d-axis and q-axis calculated depending on the required torque. The feedback control may be a proportional-integral control. The command voltage Vc thus set is converted into an AC signal such as a sinusoidal signal.

The offset correcting section 72 makes a correction to the command voltage Vc by adding thereto an offset voltage Δ. This is performed to fix the polarity of the voltage of the capacitor C under condition that the command voltage Vc is an AC signal such as a sinusoidal signal whose amplitude center is 0 volt. By making such a correction, the voltage of the capacitor C is controlled so as to vary around the offset voltage Δ as its amplitude center. Incidentally, it is sufficient that the offset voltage Δ is not smaller than a maximum value of the amplitude of the command voltage Vc for fixing the polarity of the voltage of the capacitor C, however, in this embodiment, the offset voltage Δ is set to a voltage which is higher than the maximum value of the command voltage Vc by a predetermined value. This is to make the variation rate of the output current due to the chopper control larger than a predetermined value in view of the fact that the current variation due to the chopper control depends on the voltage of the capacitor C and the voltage of the high voltage battery 12.

The command voltage Vc which has been offset-corrected is received by the deviation value calculating section 74. The deviation value calculating section 74 subtracts the output voltage Vout of the converter (the voltages VCu, VCv and VCw applied to the respective phases of the motor 10) from the output of the offset correcting section 72. The output of the deviation value calculating section 74 is received by the feedback control section 76 which performs a proportional-integration control. In this proportional-integration control, a proportion gain K is set depending on the capacitance of the capacitor C and a required rate of variation of the voltage of the capacitor C. The output of the feedback control section 76 is received by the feedforward correcting section 78. The feedforward correcting section 78 calculates an output command value iCc to be given to the side of the capacitor C and the motor 10 by adding the output current Tout to the output of the feedback control section 76. The output command value iCc indicates a sum of a current to be supplied to the capacitor C and a current to be supplied to the motor 10. The pulse width calculating circuit 80 calculates an on-time period tp of the power switching element S1 and S4 or an on-time period tn of the power switching elements S2 and S3 on the basis of the output command value iCc, the voltage of the high voltage battery 12 (the input voltage Vin) and the output voltage Vout, in order to make the output current flowing to the side of the capacitor C and the motor 10 equal to the output command value iCc. The output section 82 generates the operation command signals g1 and g4 for the power switching elements S1 and S4, and the operation command signals g2 and g3 for the power switching elements S2 and S3 on the basis of the on-time period tp or the on-time period tn, and also generates the resistance value command signal Rc.

Figure 5A:
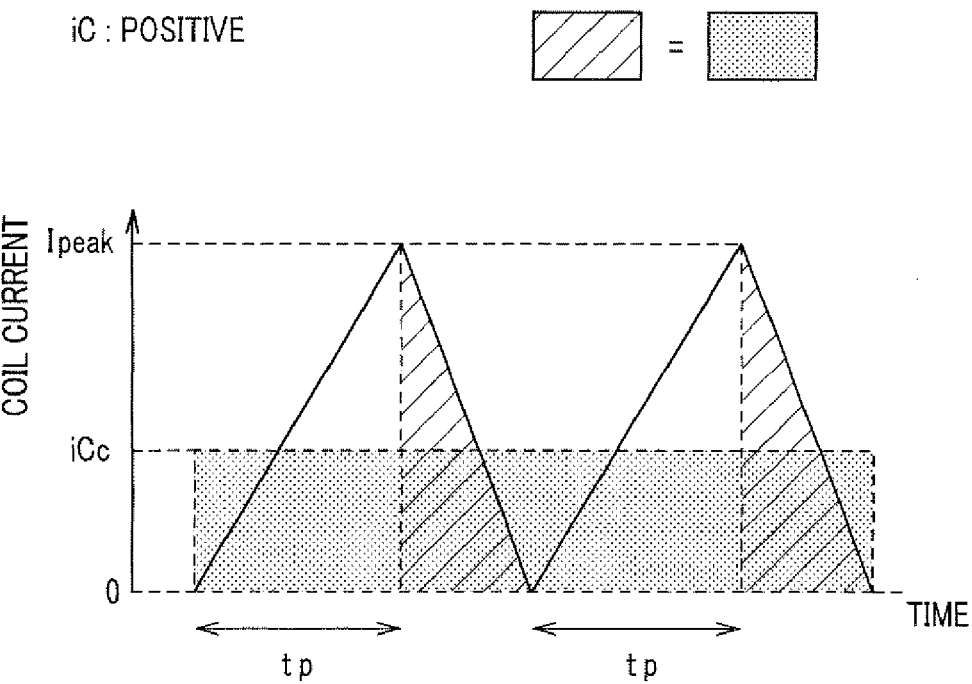
FIGS. 5A and 5B are time charts for explaining an operation of setting an output command value performed by the control apparatus of the first embodiment.

Next, the operation of the pulse width calculating circuit 80 is explained with reference to FIG. 5A showing the current flowing through the coil L when the sign of the output current iC is positive. Here, the on-time period tp indicates a time period over which the power switching elements S1 and S4 are on. As shown in this figure, when the power switching elements S1 and S4 are turned on, the current flowing through the coil L gradually increases as explained with reference to FIG. 3A. Thereafter when the on-time period tp elapses, the switching elements S1 and S4 are turned off as a result of which the current flowing through the coil L gradually decreases as explained with reference to FIG. 3B. In this embodiment, when the current flowing through the coil L becomes 0, the power switching elements S1 and S4 are turned on again.

On a microscopic time scale, the current flowing to the side of the capacitor C and the motor 10 cannot be made equal to the command value iCc, because this current flows only during the time period in which the switching elements S1 and S4 are off, and this current gradually decreases. Accordingly, in this embodiment, an average of the current outputted to the side of the capacitor C and the motor 10 during a predetermined time period is made equal to the output command value iCc, and this predetermined time period is set to the on/off cycle period of the switching elements S8 and S4. In FIG. 5A, the amount of charge supplied to the side of the capacitor C and the motor 10 is indicated by the area of the hatched portion. If this area of the hatched portion can be made equal to a value of the output command value iCc integrated during one on/off cycle period, an average value of the actual output current flowing to the side of the capacitor C and the motor 10 can be made equal to the output command value iCc. This is possible by setting the on-time period tp as follows.

When the inductance of the coil L is L, the on-time period of the switching elements S8 and S4 is tp, the input voltage is Vin, and the peak current value of the current flowing through the coil L while repeating gradual increase and decrease is Ipeak, the following equation (c1) holds.

$$Vin = L \cdot Ipeak/tp \quad (c1)$$

When the off-time period is toff, and the output voltage of the capacitor is Vout, the following equation (c2) holds.

$$Vout = L \cdot Ipeak/toff \quad (c2)$$

From the equations (c1) and (c2), the following equation (c3) is obtained.

$$Vin/Vout = toff/tp \quad (c3)$$

The average value of the current supplied to the side of the capacitor C and the motor 10 during the above described one cycle period is given by the following equation (c4).

$$Ipeak \cdot toff/\{2 \cdot (tp+toff)\} = tp \cdot Vin \cdot Vin/2 \cdot L \cdot (Vin+Vout) \quad (c4)$$

If this value is equal to the output command vlaue iCc the following equation (c5) is obtained.

$$Tp = 2 \cdot L \cdot iCc \cdot (Vin+Vout)/(Vin \cdot Vin) \quad (c5)$$

Figure 5B:
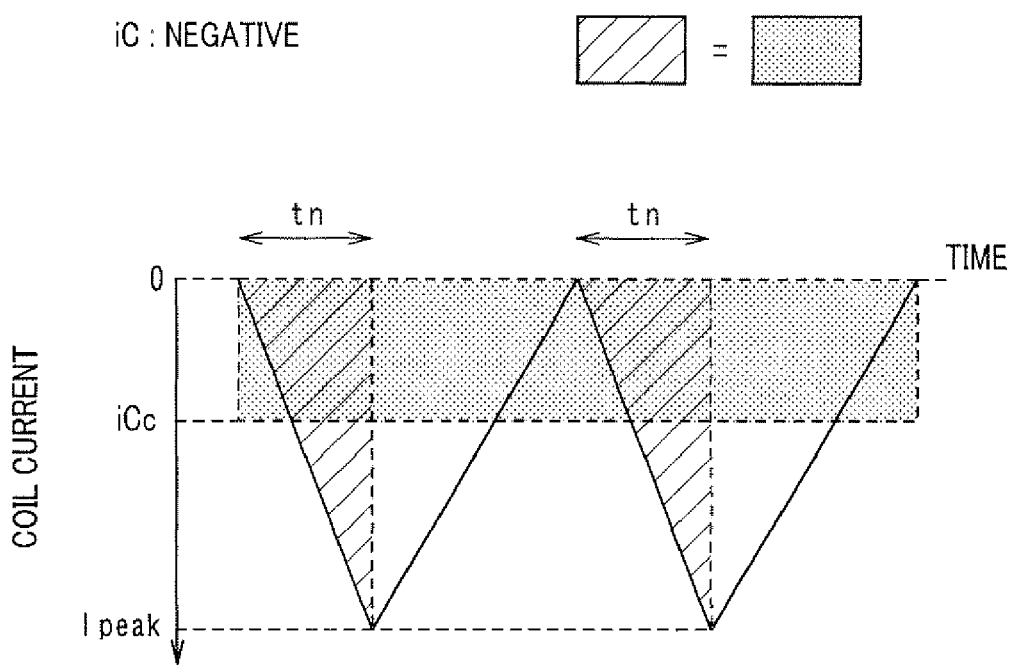

FIG. 5B shows the current flowing through the coil L when the sign of the output current iC is negative. Here, the on-time period tn indicates a period over which the power switching elements S2 and S3 are on. As shown in this figure, when the power switching elements S2 and S3 are turned on, the current flowing through the coil L gradually increases as explained with reference to FIG. 3C. Thereafter when the on-time period tn elapses, the power switching elements S2 and S3 are turned off as a result of which the absolute value of the current flowing through the coil L gradually decreases as explained with reference to FIG. 3D. In this embodiment, when the current flowing through the coil L becomes 0, the power switching elements S2 and S3 are turned on again.

Also in this case, in order to make the average value of the output current flowing to the side of the capacitor C and the motor 10 during the predetermined time period equal to the output command value iCc, the amount of charge extracted from the side of the capacitor C and the motor 10 (indicated by the area of the hatched portion) during the on-time period tn is made equal to a value of the output command value iCc integrated during one on/off cycle period of the power switching elements S2 and S3. This is possible by setting the on-time period tn in accordance with the following equation (C6).

$$tn = 2 \cdot L \cdot (-iCc) \cdot (Vin+Vout)/(Vin \cdot Vout) \quad (c6)$$

As understood from the equations (c5) and (c6), the on-time periods tp and tn can be calculated from the output command value iCc, input voltage Vin and output voltage Vout. Which of the on-time period tp and the on-time period tn should be used is determined by the sign of the output command value iCc.

Figure 6:
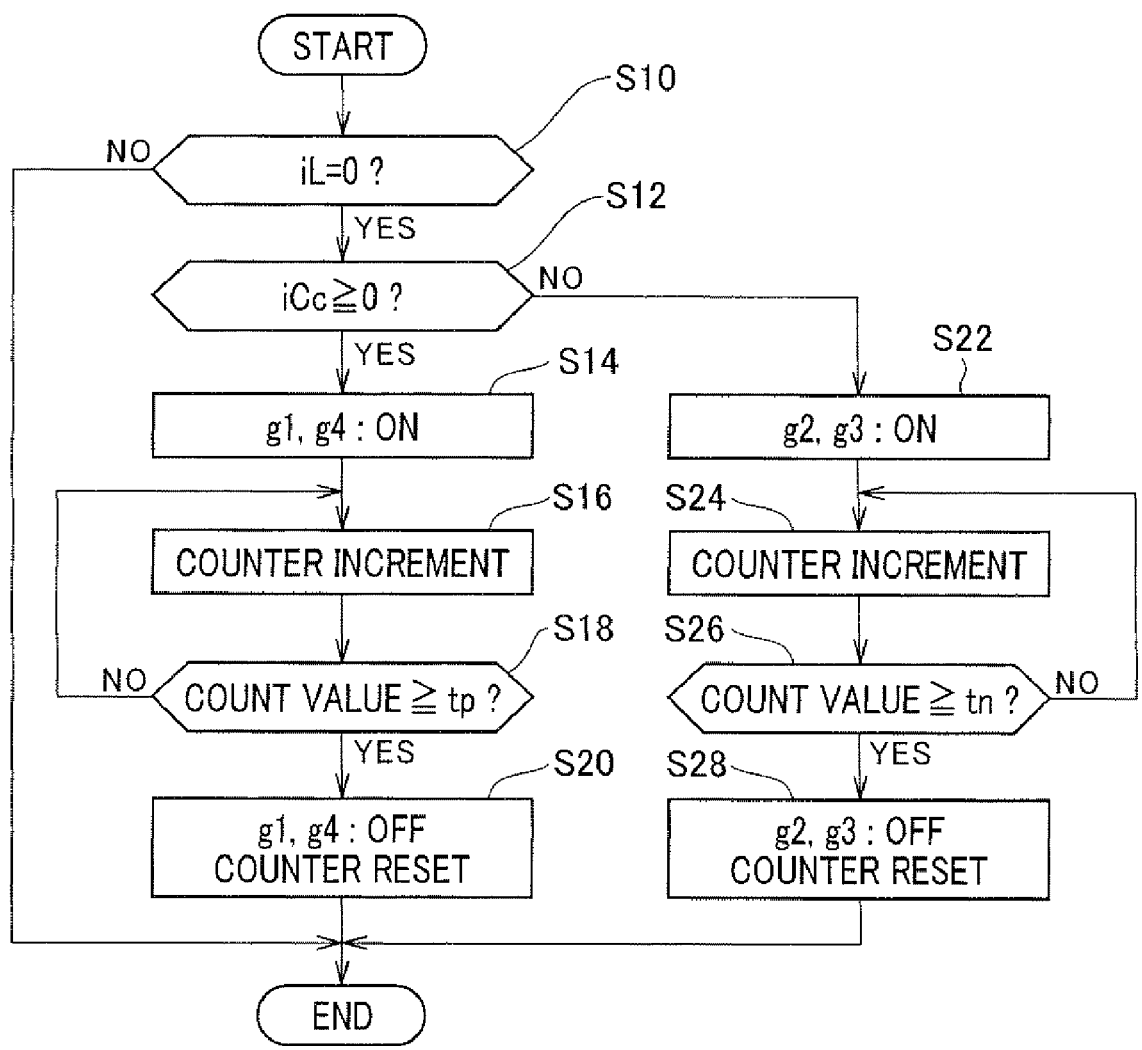
FIG. 6 is a flowchart showing a chopper control process performed by the control apparatus of the first embodiment.

The chopper control process performed in this embodiment is explained in the following with reference to the flowchart of FIG. 6. This process is performed at predetermined time intervals by the control apparatus 40.

This process begins by determining whether or not the current iL flowing through the coil L is 0 at step S10.

Step S10 is provided to determine whether it is timing to switch the power switching elements S1 and S4 or the power switching elements S2 and S3 from off-state to on-state. If the determination result at step S10 is affirmative, the process proceeds to step S12.

At step S12, it is determined whether or not the output command value iCc is equal to or larger than 0. Step S12 is provided to determine whether the power switching elements S1 and S4 should be turned on to supply charge to the side of the capacitor C and the motor 10, or the power switching elements S2 and S3 should be turned on to extract charge from the side of the capacitor C and the motor 10.

If the determination result at step S12 is affirmative, the process proceeds to step S14 to turn on the operation command signals g1 and g4 to thereby turn on the power switching elements S and S4. At subsequent step S16, a counter to measure the time during which the power switching elements S1 and S4 are set in an on-state is incremented, and then the process proceeds to step S18. At step S18, it is determined whether or not the count value of the counter has reached the on-time period tp. If the determination result at step S18 is affirmative, the process proceeds to step S20 where the operation command signals g1 and g4 are turned off, and the counter is reset.

On the other hand, if the determination result at step S12 is negative, the process proceeds to step S22 to turn on the operation command signals g2 and g3 to thereby turn on the power switching elements S2 and S3. As subsequent step S24, a counter to measure the time during which the power switching elements S2 and S3 are set in an on-state is incremented, and then the process proceeds to step S26. At step S26, it is determined whether or not the count value of the counter has reached the on-time period tn. If the determination result at step S26 is affirmative, the process proceeds to step S28 where the operation command signals g2 and g3 are turned off, and the counter is reset.

According to the above described chopper control process, it is possible to make the voltage of the capacitor C an AC voltage whose amplitude center is equal to the offset voltage Δ.

Figure 7:
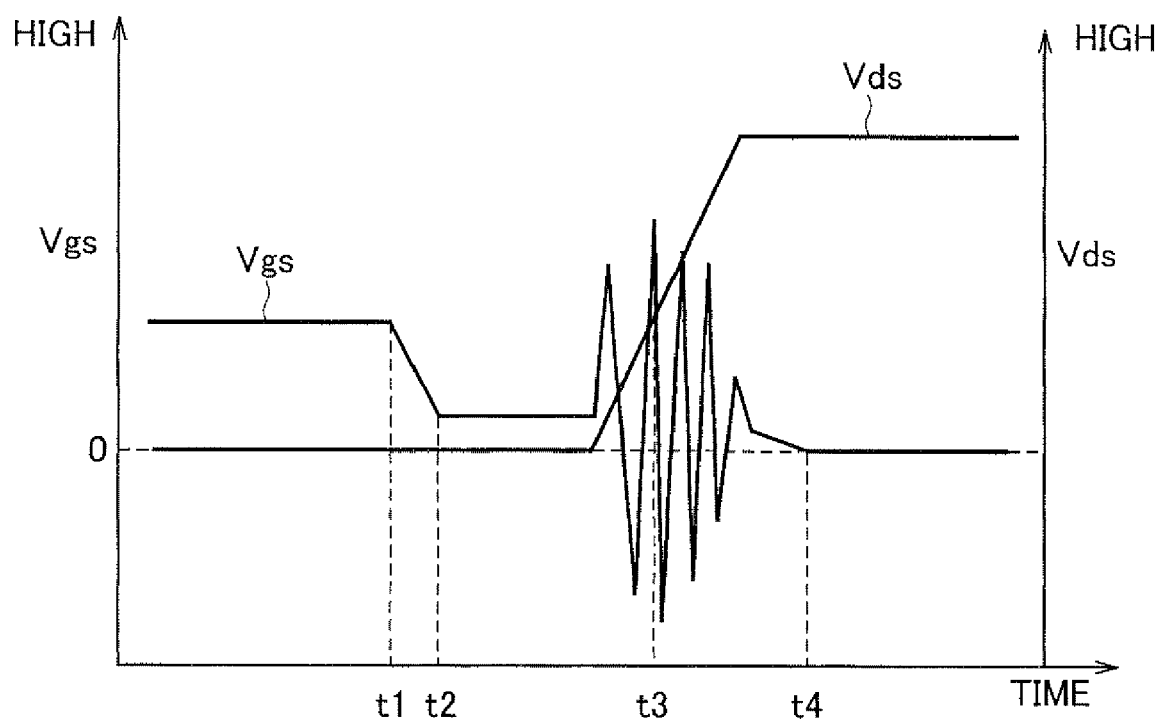
FIG. 7 is a time chart showing ringing noise occurring in the power switching element included in the power conversion apparatus of the first embodiment.

However, since the switching speed of the power switching elements S1 to S4 may become very fast in this process, ringing noise may occur in the gate voltage when the switching elements are switched from on-state to off-state, as a result of which the gate voltage fluctuates to a large extent as shown in FIG. 7. In the case shown in FIG. 7, the operation command signal is set to a state to require a switching from on-state to off-state at time t1, and the charge in the gate starts to be discharged at time t1. As a result, the gate voltage Vgs lowers once, and then lowers again to 0 at time t4 after a lapse of the so-called mirror period from time t2 to time t3 in which the gate voltage remains stationary. The inventors of the present application have found that there occurs a phenomenon in which high amplitude noise is superimposed on the gate voltage Vgs during a period from halfway of the mirror period to the time immediately before the gate voltage Vgs becomes 0. This period coincides with the period in which the power switching elements S1 to S4 are turned off, and accordingly, the drain-source voltage Vds changes rapidly. In addition, the inventors have found that this noise may exceed the withstand voltage of the gate insulation film between the gate and source.

Figure 8:
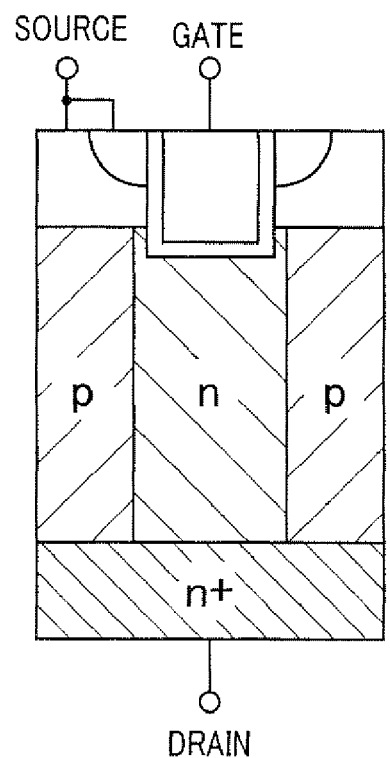
FIG. 8 is a cross-sectional view of the power switching element included in the power conversion apparatus of the first embodiment.

In this embodiment, a super junction MOSFET having a cross-sectional structure as shown in FIG. 8 is used as the power switching element Si. The super junction MOSFET is characterized in that it includes stripe-like p and n layers, instead of the n⁻ layer which causes the on-resistance in a conventional MOSFET to increase. Accordingly, the MOSFET used in this embodiment has a large parasitic capacitance, because the p-n junction area is large. This becomes a cause of the large ringing noise.

In addition, in this embodiment, since the power conversion apparatus having the circuit structure to operate as a DOC/DC converter is used to drive an AC load (the motor 10), the switching frequency thereof becomes very high compared to the case where it is used to drive a DC load. This also becomes a cause of the large ringing noise. Such ringing noise is caused not only by the use of the super junction MOSFET, but also the increase of the switching frequency.

It may occur that Zener diodes connected to each other at their anodes are connected between the gate and the source in order to prevent the ringing noise from exceeding the withstand gate-source voltage. However, since the switching frequency is as high as from several hundred kHz to several hundred MHz, the ringing noise cannot be eliminated by the Zener diodes.

Figure 9:
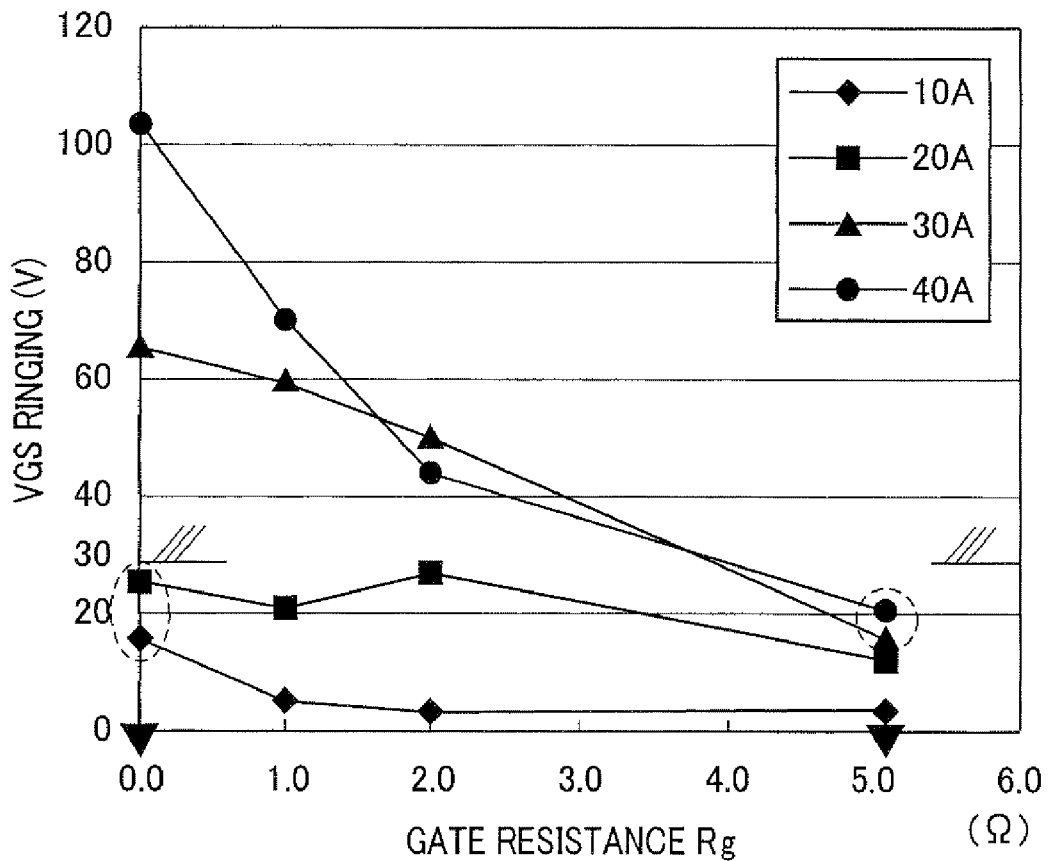
FIG. 9 is a graph showing relationships between ringing noise and a gate resistance of the power switching element in the power conversion apparatus of the first embodiment.

Accordingly, in this embodiment, the ringing noise is reduced by increasing the gate resistance. FIG. 9 is a graph showing a relationship between the gate resistance Rg and the ringing noise superimposed in the gate-source voltage Vgs for each of the cases where the current flowing between the input terminals of the power switching elements Si (the source-drain current) is 10 A, 20 A, 30 A and 40 A, respectively.

As shown in this graph, although the ringing noise increases as the source-drain current increases, it can be significantly reduced by increasing the gate resistance Rg. For example, by setting the gate resistance Rg to 5Ω, the ringing noise can be sufficiently reduced. In this embodiment, the withstand gate-source voltage is 30 V.

Figure 10:
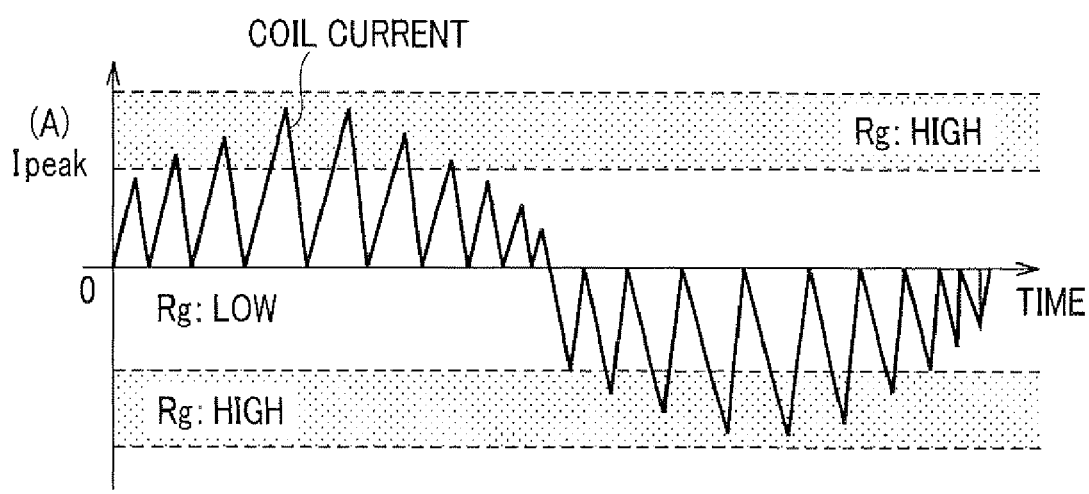
FIG. 10 is a time chart showing a relationship between peak values of a coil current and a gate resistance of the power switching element in the power conversion apparatus of the first embodiment.

In view of this, in this embodiment, the gate resistance Rg is switched in a manner shown in FIG. 10. That is, the gate resistance Rg is switched to a high value when the peak current value Ipeak of the current flowing through the coil L (may be referred to as "coil current" hereinafter) exceeds a predetermined threshold value. This makes it possible to maintain reliability of the power switching element Si, while suppressing power loss (switching loss) as much as possible. In more detail, when the peak current value Ipeak of the coil current is small, and accordingly, the switching frequency is high (several ten MHz, for example), the gate resistance Rg is switched to a smaller value in order to increase the switching speed to thereby reduce the switching loss per unit time. On the other hand, when the peak current value Ipeak of the coil current is large, since the switching frequency is low (several hundred KHZ to several MHz, for example), the increase of power loss per unit time due to increase of the gate resistance Rg is relatively small. The above switching manner of the gate resistance Rg is advantageous particularly in this embodiment, because the power conversion apparatus drives the AC load (the motor 10), and accordingly the switching frequency varies periodically over a wide range of several-fold to several ten-fold.

Figure 11:
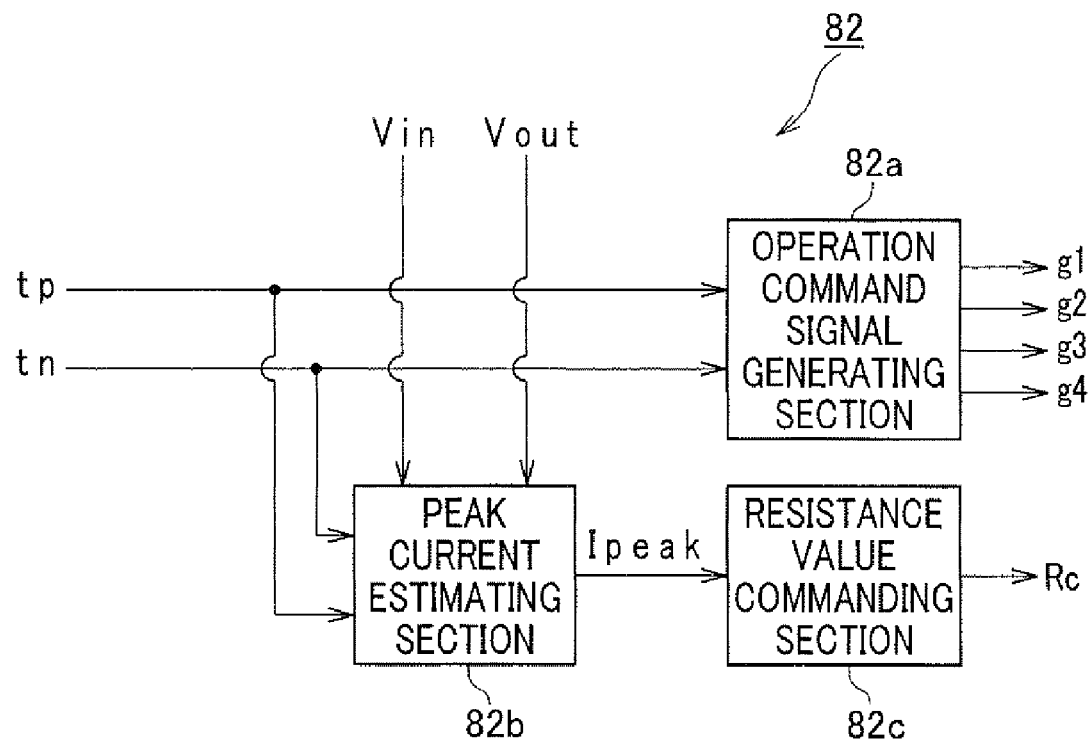
FIG. 11 is a block diagram of a pulse width calculating section included in the control apparatus of the first embodiment.

Next the operation of the output section 82 is explained with reference to FIG. 11 showing a structure of the output section 82.

As shown in FIG. 11, the output section 82 includes an operation command signal generating section 82*a*, a peak current value estimating section 82*b*, and a resistance value commanding section 82*c*. The operation command signal generating section 82*a* generates the operation command signals g1 to g4 in accordance with the on-time period tp or tn. The peak value estimating section 82*b* estimates the peak current value Ipeak of the coil current on the basis of the on-time period tp and the input voltage Vin, or on the basis of the on-time period tn and the output voltage Vout. When the output command value iCc is positive, the peak current value Ipeak can be estimated on the basis of the foregoing equation (c1). When the output command value iCc is negative, the peak current value Ipeak can be estimated on the basis of the foregoing equation (c1) modified to apply to the on-time period tn and the output voltage Vout. The resistance value commanding section 82*c* outputs the resistance value command signal Rc determined in accordance with the estimated peak current value Ipeak.

Figure 12:
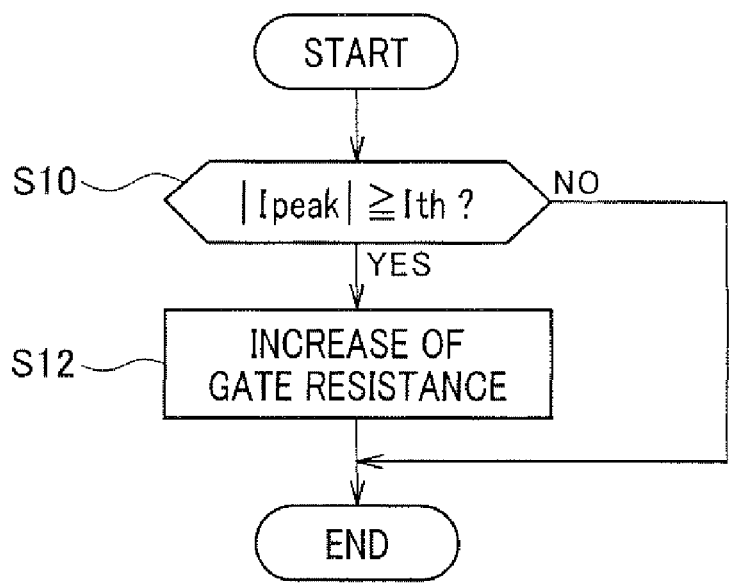
FIG. 12 is a flowchart showing an operation process performed by a resistance value commanding section included in the control apparatus of the first embodiment.

FIG. 12 is a flowchart showing an operation process performed at regular time intervals by the resistance value commanding section 82*c*.

This process begins by determining whether or not the absolute value of the peak current value Ipeak is equal to or larger than a threshold current value Ith at step S10. Step 310 is provided to determine whether the gate resistance kg should be increased or not. In this embodiment, the threshold current value Ith is set to about 20 A. If the determination result at step S10 is affirmative, the process proceeds to step S12 where the resistance value command signal Rc is set to such a logical value as to increase the gate resistance Rg. As a result, the switching element 64 of the drive circuit Dr is turned off, and accordingly, the resistance of the discharge path of the power switching element S1 is increased. When step S12 is completed, or if the determination result at step S10 is negative, the process is terminated.

Figure 13A:
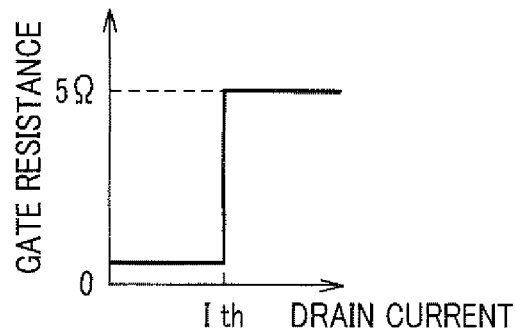
FIGS. 13A and 13B are diagrams showing a relationship between a drain current and a gate resistance of the switching element included in the power conversion apparatus of the first embodiment.
Figure 13B:
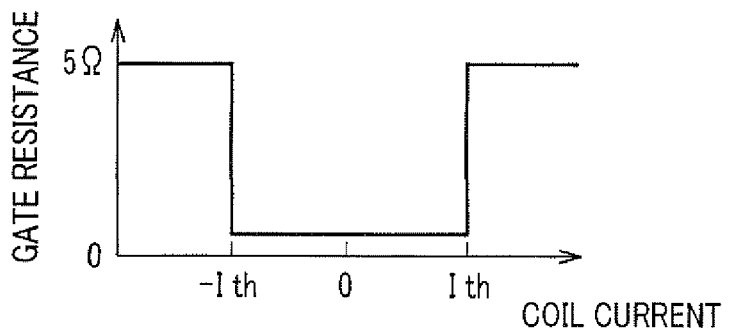

According to the above process, as shown in FIG. 13A, when the drain current of the power switching element Si exceeds the threshold current value Ith, the gate resistance Rg is increased to 5Ω. In other words, as shown in FIG. 13B, when the absolute value of the coil current exceeds the threshold current value Ith, the gate resistance Rg is increased to 5Ω. The above setting is made in view of the measurement result shown in FIG. 9 that when the gate resistance Rg is 5Ω, the ringing noise occurring when the power switching element Si interrupts the large current is reduced below the withstand gate-source voltage. By performing the chopper control with the gate resistance Rg being set not above 5Ω, the power conversion apparatus can exhibit good control response even when the switching frequency is as fast as several hundred kHz to several hundred MHz.

The first embodiment of the invention described above provides the following advantages.

(1) The switching speed of the power switching element Si (the resistance value command signal Rc) is set to such a value that the noise that occurs between the conduction control terminal (the gate) and the output terminal (the source) depending on the current interrupted by the power switching element Si when the power switching element Si is turned off does not exceed the withstand voltage. This makes it possible to control the output voltage, while keeping the reliability of the power switching element Si at high level.

(2) The switching speed is reduced by increasing the gate resistance Rg when the current interrupted by the power switching element Si is large. This makes it possible to prevent as much as possible the power loss per unit time from increasing, while keeping the reliability of the power switching element Si at high level.

(3) An amount of the coil current interrupted by the power switching element Si is estimated on the basis of the on-time periods tp and tn of the power switching element Si. This makes it possible to accurately determine whether the absolute value of the peak current value Ipeak of the coil current exceeds the threshold current value Ith without increasing the sampling cycle frequency of the current sensors 22, 26 and 30.

(4) The output voltage of the power conversion apparatus is controlled to such a value that an AC current flows between the power conversion apparatus and the electrical load (the motor 10). Since such a control tends to cause the switching frequency of the power switching element Si to increase, and accordingly noise exceeding the withstand voltage tends to occur between the gate and the source of the power switching element Si, this embodiment is advantageous especially in performing such a control.

(5) The electric path for extracting the charge in the gate of the power switching element Si includes a plurality of resistors disposed between the gate of the power switching element Si and the driver IC 52, so that the resistance of the electrical path can be varied by changing the number of the resistors selected to be parallel-connected to each other between the gate and the driver IC 52. This makes it possible to vary the gate resistance Rg with ease.

(6) As the power switching element, a MOSFET is used. This makes it possible to perform the chopper control at a high switching frequency.

Second Embodiment

Next, a second embodiment of the invention is described below with focus on the difference with the first embodiment.

Figure 14:
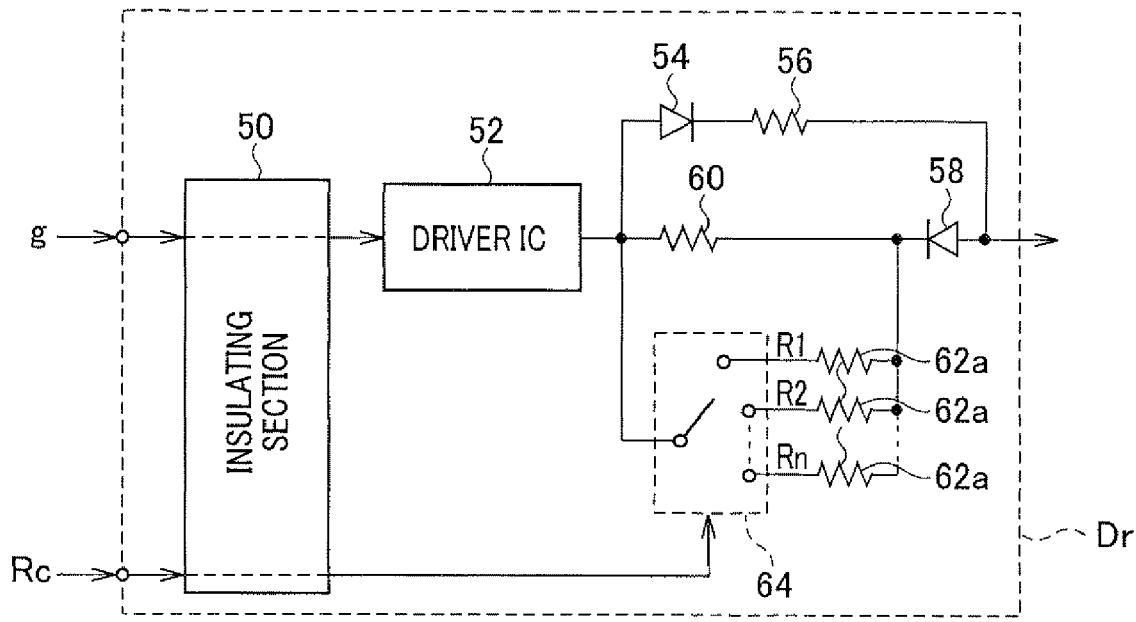
FIG. 14 is a diagram showing a circuit structure of drive circuits to drive switching elements included in a power conversion apparatus of a power conversion system of a second embodiment of the invention.

FIG. 14 is a diagram showing a circuit structure of the drive circuit Dr used in the second embodiment. In FIG. 14, the same reference characters as those shown in FIG. 2 denote the same or equivalent components.

As shown in FIG. 14, in this embodiment, the drive circuit Dr includes a plurality of resistors 62a having different resistances, and a selector for connecting required one or ones of the resistors 62a between the gate of the switching element Si and the driver IC 52. This makes it possible to adjust the resistance of the electric path for discharging the charge in the gate of the power switching element Si in multistage.

Figure 15A:
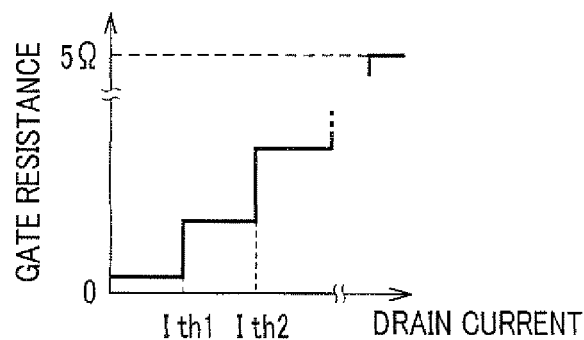
FIGS. 15A and 15B are diagrams showing a relationship between a drain current and a gate resistance of the switching element included in the power conversion apparatus of the second embodiment.
Figure 15B:
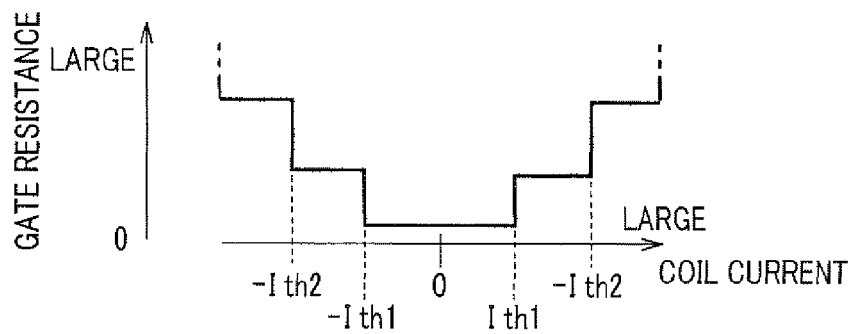

Next, a manner of setting the gate resistance Rg in this embodiment is explained with reference to FIGS. 15A and 15B. FIG. 15A shows a relationship between the drain current and the gate resistance Rg, and FIG. 15B shows a relationship between the coil current and the gate resistance Rg. As shown in these figures, in this embodiment, the gate resistance Rg is adjusted in multiple stages within the upper limit of 5Ω depending on the drain current by selecting from among a plurality of threshold current values Ith1, Ith2, . . . . According to the second embodiment, the gate resistance Rg can be reduced as much as possible, while preventing noise of a level which can lower the reliability of the power switching element Si from occurring between the gate and the source more effectively than the first embodiment.

Third Embodiment

Next, a third embodiment of the invention is described below with focus on the difference with the first embodiment.

In this embodiment, the on-time period is measured in the drive circuit Dr on the basis of the operation command signal gi instead of outputting the resistance value command signal Rc from the control apparatus 40, the coil current is estimated on this measured on-time period, and the gate resistance Rg is adjusted in accordance with this estimated coil current.

Figure 16:
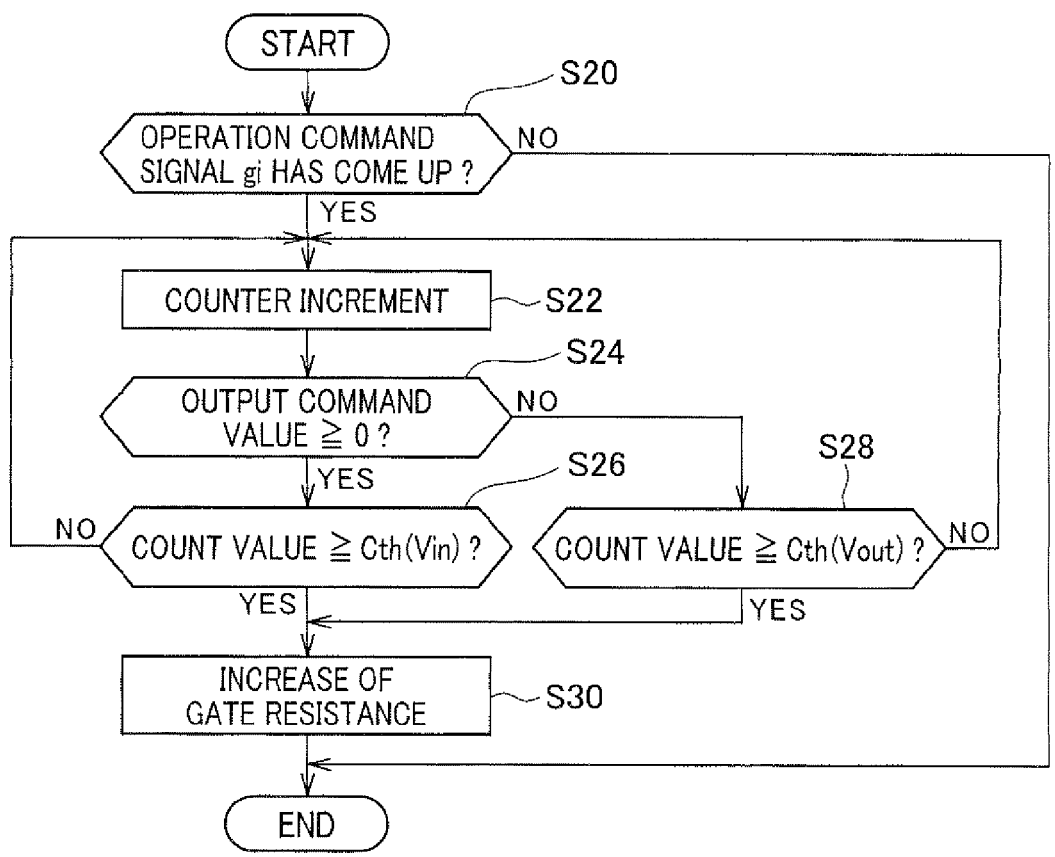
FIG. 16 is a flowchart showing an operation process performed by a resistance value commanding section of a control apparatus of a power conversion system of a third embodiment of the invention.

FIG. 16 is a flowchart showing a process for adjusting the gate resistance Rg performed at regular time intervals by the drive circuit Dr.

This process begins by determining at step S20 whether or not the operation command signal gi has come up.

Step S 20 is provided to determine whether it is timing to switch the power switching element Si from off-state to on-state. If the determination result at step S20 is affirmative, the process proceeds to step S22 where a counter to measure the on-time period is incremented. At subsequent step S24, it is determined whether or not the output command value iCc is equal to or larger than 0.

If the determination result at step S24 is affirmative, the count value of the counter is compared with a threshold value Cth(Vin) variably set depending on the input voltage Vin at step S26. This is performed because when the output command value iCc is equal to or larger than 0, the coil current depends on the on-time period and the input voltage Vin. More precisely, the threshold value Cth(Vin) is set smaller as the input voltage Vin becomes larger to keep the gate resistance Rg at the same value for the same value of the coil current. On the other hand, if the determination result at step S24 is negative, the count value of the counter is compared with a threshold value Cth(Vout) at step S28. This is performed because when the output command value iCc is negative, the coil current depends on the output voltage Vout. More precisely, the threshold value Cth(Vout) is set smaller as the output voltage Vout becomes larger to keep the gate resistance Rg at the same value for the same value of the coil current.

If the count value is determined to have reached the threshold value Cth(Vin) or threshold value Cth(Vout) at step S26 or at step S28, since it means that the coil current has reached the peak current value Ipeak, the process proceeds to step S30 to increase the gate resistance Rg, and otherwise returns to step S22.

The third embodiment described above provides, in addition to the advantages (1), (2) and (4) to (6) described in the foregoing, the following advantages.

(7) The gate resistance Rg is adjusted in accordance with the on-time period of the power switching element Si. This makes it possible to adjust the gate resistance Rg in accordance with an amount of the coil current interrupted by the power switching element Si.

(8) The threshold value Cth used to adjust the gate resistance Rg is variably set in accordance with the input voltage Vin or output voltage Vout. This makes it possible to keep the gate resistance kg at the same value for the same amount of the coil current interrupted by the power switching element Si.

(9) The gate resistance Rg is set to a smaller value at the beginning of the measurement of the on-time period. This makes it possible to perform the switching process of the gate resistance Rg only when the coil current increases.

(10) The on-time period is measured on the high voltage side (the drive circuit Dr side), and the gate resistance Rg is adjusted in accordance with the measured on-time period. This makes it possible to reduce the number of insulating components needed for insulation between the low voltage side (the control apparatus 40 side) and the high voltage side (the drive circuit Dr side).

It is a matter of course that various modifications can be made to the above described embodiment as described below.

In the second embodiment, only one of the resistors 62a is selected as a resistor to be parallel-connected to the resistor 60 to adjust the gate resistor Rg. However, two or more of the resistors 62a may be parallel-connected to the resistor 60 to adjust the gate resistor Rg as necessary.

In the first and second embodiments, in order to enable the converter to output a required voltage, the gate resistance Rg is made variable not only for the pair of the power switching elements S1 and S4, but also for another pair of the power switching elements S2 and S3, the gate resistance Rg may be made variable only one of the two pairs.

In the third embodiment, the gate resistance Rg is set to either the high value or to the low value in accordance with whether the count value of the counter measuring the on-time period exceeds the threshold value Cth. However, the third embodiment may be so modified that the gate resistance Rg is adjustable in multistage as in the case of the second embodiment.

In the third embodiment, the threshold value Cth is varied in accordance with the output voltage Vout or the input voltage Vin. However, the third embodiment may be so modified that the increment speed of the counter to measure the on-time period is varied in accordance with the output voltage Vout or the input voltage Vin. Also in this case, the gate resistance Rg can be kept at the same value for the same value of the coil current.

In the third embodiment, the threshold value Cth is variably set in accordance with the input voltage Vin when the output command value iCc is positive, however, if the high voltage battery 12 can be regarded as a stabilized voltage source whose output voltage variation is negligibly small irrespective of the charge flowing therefrom or flowing thereinto, it is not necessary to variably set the threshold value Cth.

The MOSFET used in the above embodiments is not limited to a super junction MOSFET. For example, it may be a silicon carbide MOSFET.

The power switching element used in the above embodiment is not limited to a MOSFET. Generally when the switching speed of a voltage-controlled type switching element is high, noise exceeding a withstand voltage may occur between the conduction control terminal and output terminal of the voltage-controlled type switching element. Accordingly, the present invention is advantageous when voltage-controlled type switching elements are used. Here, if the switching element is a power switching element passing a current as large as 20 A or more, since the possibility that noise exceeding the withstand voltage occurs between the conduction control terminal and output terminal of the power switching element is high, the present invention is particularly advantageous.

In the above embodiments, the gate resistance Rg is variably set in accordance with the current flowing through the switching element, however, the voltage applied to the gate of the switching element may be variably set instead of variably setting the gate resistance Rg. Also in this case, it is possible to adjust the switching speed of the switching element at the time of turning off the switching element by selecting either one of switching the gate voltage from positive to negative to discharge the gate, and switching the gate voltage from positive to zero. Since the relationship between the gate resistance Rg and noise can be regarded equivalent to a relationship between the switching speed and noise, the ringing noise can be reduced also by this setting manner.

in the above embodiments, although the gate resistance Rg is adjusted when the switching element is switched from on-state to off-state, the gate resistance Rg may be adjusted also when the switching element is switched from off-state to on-state.

Figure 17A:
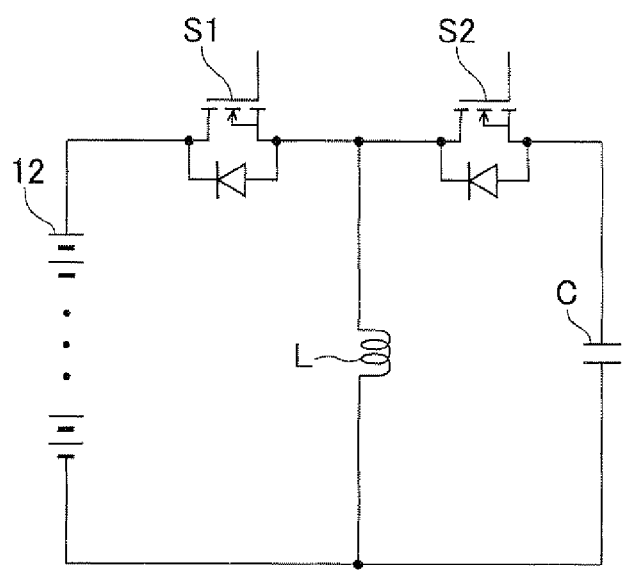
FIGS. 17A to 17C are diagrams each showing a circuit structure of a converter constituting a modification of the power conversion apparatus of the above embodiments of the invention.
Figure 17B:
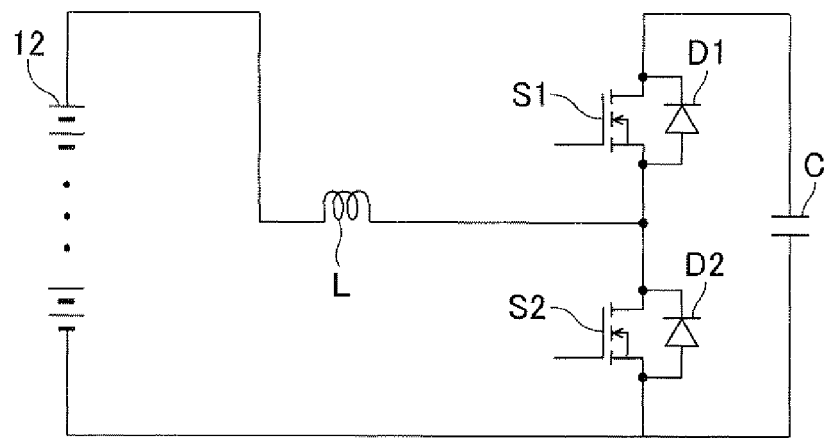
Figure 17C:
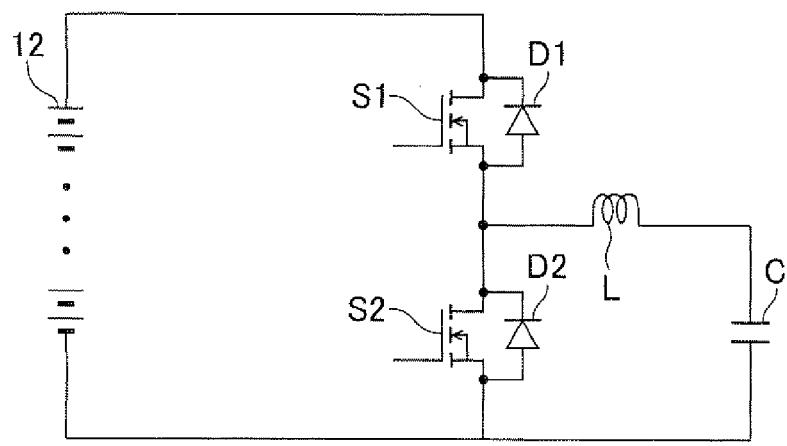

The power conversion apparatus is not limited to the one shown in FIG. 1. For example, it may be a back-boost converter as shown in FIG. 17A. This back-boost converter includes a capacitor C, a series connection of switching elements S1 and S2 connecting the positive terminal of the high voltage battery 12 to one electrode of the capacitor C, a coil L connecting the connection node of the switching elements S1 and S2 to the negative terminal of the high voltage battery 12 and the other terminal of the capacitor C, and diodes D1 and D2 respectively parallel-connected to the switching elements S1 and S2. For another example, it may be a boost converter as sown in FIG. 17B. This boost converter includes a capacitor C, a series connection of switching elements S1 and S2 parallel-connected to the capacitor C, a coil L connecting the connection node of the switching elements S1 and S2 to the positive terminal of the high voltage battery 12, and diodes D1 and D2 respectively parallel-connected to the switching elements S1 and S2. For still another example, it may be a step-down converter as shown in FIG. 17C. This step-down converter includes a capacitor C, a series connection of switching elements S1 and S2 parallel-connected to the high voltage battery 12, a coil L connecting the connection node of the switching elements S1 and S2 to one terminal of the capacitor C, and diodes D1 and D2 respectively parallel-connected to the switching elements S1 and S2. To use such converters in the third embodiment, it may be necessary to change parameters referred to at the time of variably setting the threshold value Cth, However, in any of these converters, the threshold value Cth can be properly set in accordance with at least one of the output voltage Vout and the input voltage Vin.

The TCV is not limited to the one that includes non-insulation type converters for the respective phases of the motor 10. For example, it may be one that includes insulation-type converters.

The motor 10 is not limited to a three-phase motor. For example, it may be a single-phase motor, or a 5-phase motor. In this case, instead of the TCV, a power conversion circuit including converters for the respective phases of the motor is used. Furthermore, the above embodiments can be used to control not a motor but an alternator.

In the above embodiments, the TCV is connected to the motor as a drive power generating apparatus of a hybrid vehicle. However the present invention is applicable to an electric rotating machine mounted on an electric vehicle.

In the above embodiments, the TCV is used to supply power to a motor mounted on a vehicle as a drive power generating apparatus. However, the present invention is applicable to a TCV used to supply power to a motor of an air-conditioning apparatus mounted on a vehicle.

Furthermore, the present invention is applicable to a power conversion apparatus used to supply power to an uninterruptible power supply (UPS) which outputs an AC power supply voltage. The present invention is also applicable to a DC/DC converter connected between a high voltage battery and an inverter supplying power to an electric rotating machine mounted on a vehicle.

The above explained preferred embodiments are exemplary of the invention of the present application which is described solely by the claims appended below. It should be understood that modifications of the preferred embodiments may be made as would occur to one of skill in the art.

What is claimed is:

1. A control apparatus for controlling a power conversion apparatus including at least one voltage-controlled type switching element provided with a drive circuit, and a coil connected to said switching element, said control apparatus operating to adjust an absolute value of a current chopped by repeating on/off operation of said switching element and flowing through said coil in order to convert an input voltage of said power conversion apparatus to a required output voltage, said control apparatus comprising a configuration to perform:

a first function of outputting an operation command signal to said drive circuit of said switching element to control an output voltage of said power conversion apparatus, said operation command signal indicating one of on-state and off-state of said switching element;

a second function of setting, on the basis of a current value of a current flowing through said switching element, a switching speed of said switching element to such a value that noise exceeding a withstand voltage between a conduction control terminal and an output terminal of said switching element can be prevented from occurring when said switching element is switched between on-state and off-state by said drive circuit; and a third function of adjusting said drive circuit to drive said switching element such that said switching element is switched between on-state and off-state at said switching speed set by said second function, wherein said second function reduces said switching speed when said current value is larger than a redetermined threshold; and wherein said switching element is turned on when said current value is decreased to a predetermined value, and said second function determines said switching speed on the basis of said current value at a time when said switching element is switched from on-state to off-state.

2. A control apparatus for controlling a power conversion apparatus including at least one voltage-controlled type switching element provided with a drive circuit, and a coil connected to said switching element, said control apparatus operating to adjust an absolute value of a current chopped by repeating on/off operation of said switching element and flowing through said coil in order to convert an input voltage of said power conversion apparatus to a required output voltage, said control apparatus comprising a configuration to perform:

a first function of outputting an operation command signal to said drive circuit of said switching element to control an output voltage of said power conversion apparatus, said operation command signal indicating one of on-state and off-state of said switching element;

a second function of setting, on the basis of a current value of a current flowing through said switching element, a switching speed of said switching element to such a value that noise exceeding a withstand value between a conduction control terminal and an output terminal of said switching element can be prevented from occurring when said switching element is switched between on-state and off-state by said drive circuit; and a third function of adjusting said drive circuit to drive said switching element such that said switching element is switched between on-state and off-state at said switching speed set by said second function;

wherein said switching element is turned on when said current value is decreased to a predetermined value, and said second function determines said switching speed on the basis of said current value at a time when said switching element is switched from on-state to off-state; and wherein said first function includes a calculating function of calculating an on-time period in which said switching element is kept in on-state for said power conversion apparatus to output a required voltage, and said second function includes an estimating function of estimating current value on the basis of said on-time period calculated by said calculating function, said second function determining said switching speed on the basis of said estimated current value.

3. A control apparatus for controlling a power conversion apparatus including at least one voltage-controlled type switching element provided with a drive circuit, and a coil connected to said switching element, said control apparatus operating to adjust an absolute value of a current chopped by repeating on/off operation of said switching element and flowing through said coil in order to convert an input voltage of said power conversion apparatus to a required output voltage, said control apparatus comprising a configuration to perform:

a first function of outputting an operation command signal to said drive circuit of said switching element to control an output voltage of said power conversion apparatus, said operation command signal indicating one of on-state and off-state of said switching element;

a second function of setting, on the basis of a current value of a current flowing through said switching element, a switching speed of said switching element to such a value that noise exceeding a withstand voltage between conduction control terminal and an output terminal of said switching element can be prevented from occurring when said switching element is switched between on-state and off-state by said drive circuit; and third function of adjusting said drive circuit to drive said switching element such that said switching element is switched between on-state and off-state at said switching speed set by said second function;

wherein said switching element is turned on when said current value is decreased to a predetermined value, and said second function determines said switching speed on the basis of said current value at a time when said switching element is switched from on-state to off-state; and wherein said second function includes a time measuring function of measuring time during which said switching element is kept in on-state, and configured to reduce said switching speed when said measured time is longer than a predetermined time.

4. The control apparatus according to claim 1, wherein said second function includes a comparing function of performing comparison between a predetermined threshold and said current value, and configured to determine said switching speed on the basis of a comparison result by said comparing function.

5. The control apparatus according to claim 1, wherein said first function controls said output voltage of said power conversion apparatus to such a value that an AC current flows between said power conversion apparatus and an electrical load applied with said output voltage of said power conversion apparatus.

6. The control apparatus according to claim 5, wherein said electrical load is an electric rotating machine.

7. The control apparatus according to claim 1, wherein said drive circuit includes a current path through which charge in said conduction control terminal of said switching element is extracted when said switching element is switched from on-state to off-state, resistance of said current path being adjustable, said third function being configured to adjust said resistance of said current path to thereby adjust said switching speed.

8. The control apparatus according to claim 1, wherein said switching element is an MOSFET.

9. A power conversion system comprising a power conversion apparatus and a control apparatus as recited in claim 1.

* * * * *